United States Patent [19]
Bellur et al.

[10] Patent No.: US 6,184,462 B1
[45] Date of Patent: Feb. 6, 2001

(54) APPARATUS FOR RETAINING A PRINTED CIRCUIT BOARD

(75) Inventors: Ashok Bellur, Peoria; Val G. Boucher, Roanoke; Paul J. Piasse, Toluca; Stephen W. Rector, Metamora, all of IL (US)

(73) Assignee: Caterpillar Inc., Peoria, IL (US)

( * ) Notice: Under 35 U.S.C. 154(b), the term of this patent shall be extended for 0 days.

(21) Appl. No.: 09/106,564

(22) Filed: Jun. 29, 1998

(51) Int. Cl.[7] .............................. H02G 3/08; H05K 5/00
(52) U.S. Cl. .................... 174/52.1; 361/809; 248/213.2; 174/61
(58) Field of Search ..................... 174/52.1, 61; 361/807, 361/809, 825; 248/213.2

(56) References Cited

U.S. PATENT DOCUMENTS

| D. 357,947 | 5/1995 | Richer | D21/48 |
|---|---|---|---|
| 4,424,553 | * 1/1984 | Marsocci et al. | 361/825 |
| 4,748,441 | 5/1988 | Brzezinski | 340/709 |
| 5,659,334 | 8/1997 | Yaniger et al. | 345/156 |
| 5,838,551 | * 11/1998 | Chan | 361/818 |

OTHER PUBLICATIONS

CTS Corporation Series 105 Pointing Device Technical Data Sheet—developed in 1994; press release Sep. 3, 1996.
Interlink Electronics Micro Joystick Information—Jun. 3, 1996.
Measurement Systems (MS), Minature Joysticks Catalog MJ–81—before 1990.
Measurement Systems (MS), Positioning and Tracking Controls for the Human Operator, Catalog CS 85—before 1990.

* cited by examiner

Primary Examiner—Kristine Kincaid
Assistant Examiner—Hung V Ngo
(74) Attorney, Agent, or Firm—Haverstock, Garrett & Roberts

(57) ABSTRACT

In one embodiment of the present invention, an apparatus for retaining a printed circuit board includes a hollow shell structure having an aperture and an inner slot for receiving the printed circuit board and a mounting bracket including a frame portion for receiving the shell structure. A rim extends around the perimeter of the aperture and flexible flanges extend from at least a portion of the rim. The flexible flanges include a neck portion and a lower tab that provide means to retain the shell structure in the mounting bracket. The inner slot is sized to fit snugly around the perimeter of the printed circuit board when the printed circuit board is inserted in the shell structure. The shell structure is constructed of a dielectric material that substantially insulates the printed circuit board from electro-static discharge and/or other types of electrical damage or interference, as well as shock and vibrations. The present mounting bracket optionally includes support structure for mounting additional hardware components within a device and a mounting tab for attaching the mounting bracket within a device.

9 Claims, 5 Drawing Sheets

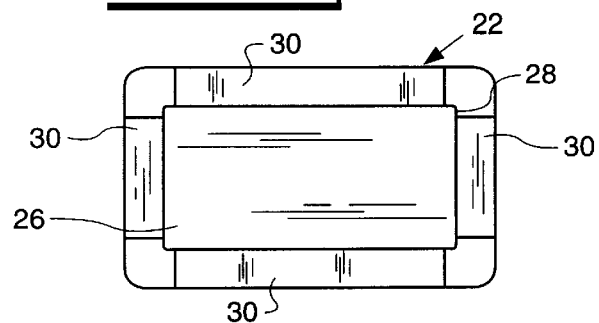
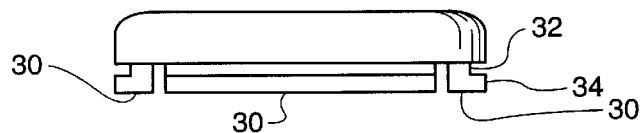
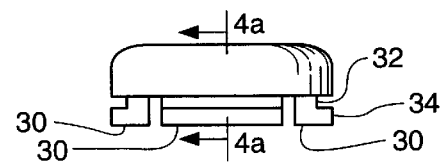
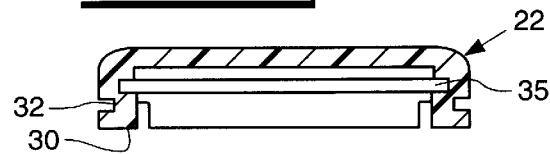
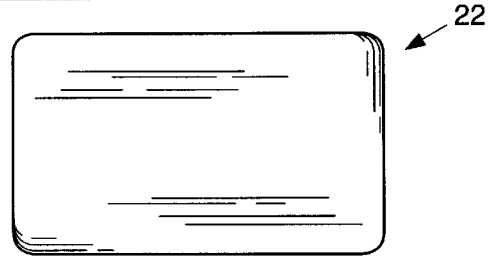

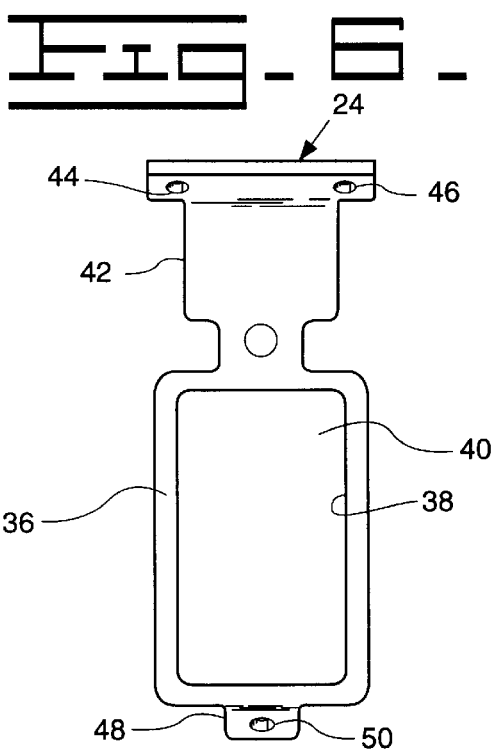
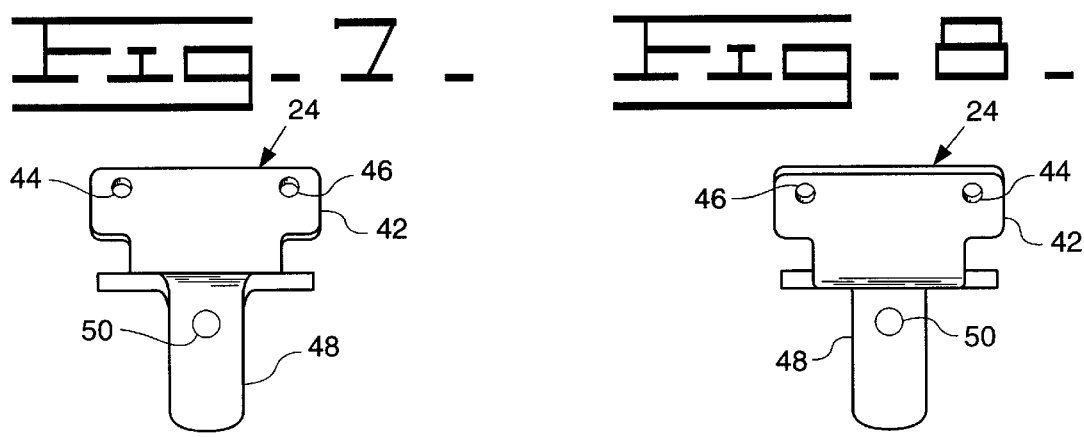
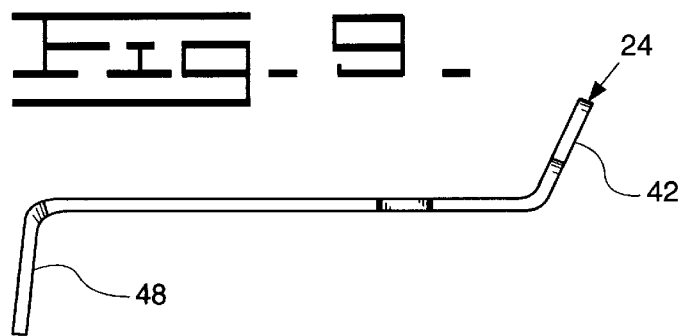

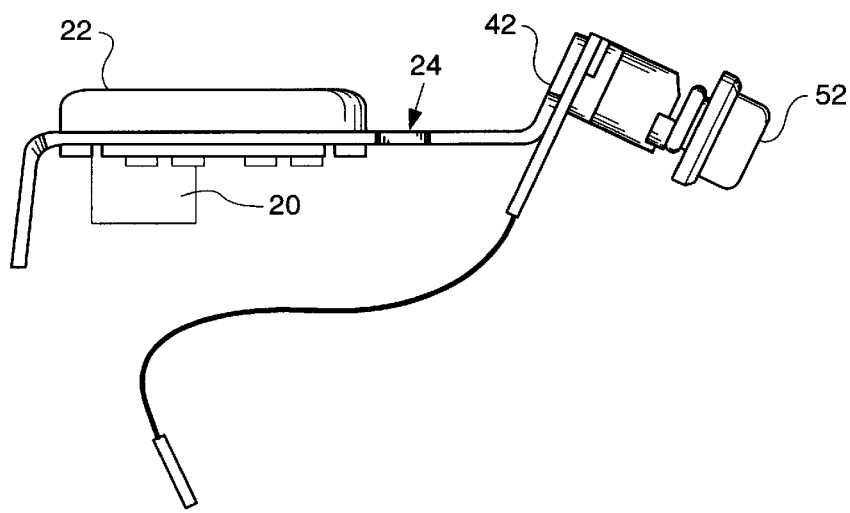
Fig_10_
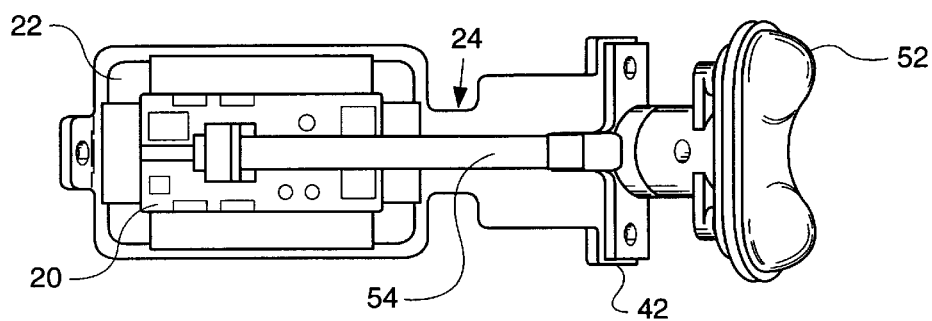
Fig_11_
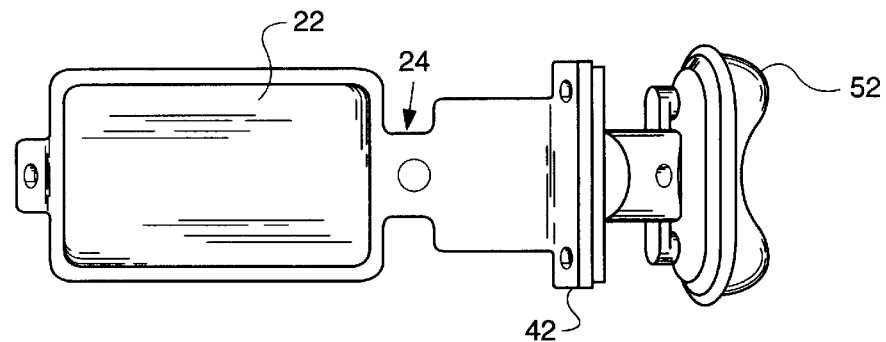
Fig_12_

APPARATUS FOR RETAINING A PRINTED CIRCUIT BOARD

TECHNICAL FIELD

The present invention relates generally to an apparatus for retaining a printed circuit board and, more particularly, to an apparatus for retaining a printed circuit board including a flexible shell structure for enclosing the printed circuit board and mounting it on a frame.

BACKGROUND

Currently, microprocessors are embedded in an increasing variety of devices. Hardware components associated with the microprocessors, such as printed circuit boards, must be placed in a variety of differently sized and shaped locations. Packaging means adaptable for use in a variety of spaces is desired. In spaces that do not allow easy access, packaging means that do not require fasteners is also desired. Further, it is desirable to provide means for insulating the hardware from vibration, shock, and electro-static discharges.

Accordingly, the present invention is directed to overcoming one or more of the problems as set forth above.

DISCLOSURE OF THE INVENTION

In one embodiment of the present invention, an apparatus for retaining a printed circuit board includes a hollow shell structure having an inner slot and an aperture for receiving the printed circuit board and a mounting bracket including a frame portion for receiving the shell structure. A rim extends around the perimeter of the aperture and flexible flanges extend from at least a portion of the rim. The flexible flanges include a neck portion and a lower tab that provide means to retain the shell structure in the mounting bracket. The inner slot is sized to fit snugly around the perimeter of the printed circuit board when the printed circuit board is inserted in the shell structure. The shell structure is constructed of dielectric material that electrically insulates the printed circuit board from electro-static discharge and/or other types of electrical damage or interference, as well as shock and vibrations. The present mounting bracket optionally includes support structure for mounting additional hardware components within a device and a mounting tab for attaching the mounting bracket within a device.

BRIEF DESCRIPTION OF DRAWINGS

FIG. 2 is a bottom view of the shell structure;

FIG. 3 is a front view of the shell structure;

FIG. 4 is a side view of the shell structure;

FIG. 4a is a cross-sectional view of the shell structure showing an inner slot;

FIG. 5 is a top view of the shell structure;

FIG. 6 is a top view of the mounting bracket;

FIG. 7 is a front view of the mounting bracket;

FIG. 8 is a back view of the mounting bracket;

FIG. 9 is a side view of the mounting bracket;

FIG. 10 is a side view of the shell structure and a control switch mounted in the mounting bracket;

FIG. 11 is a top view of the shell structure and the control switch mounted in the mounting bracket;

FIG. 12 is a bottom view of the shell structure and the control switch mounted in the mounting bracket.

BEST MODE FOR CARRYING OUT THE INVENTION

Figure 1:
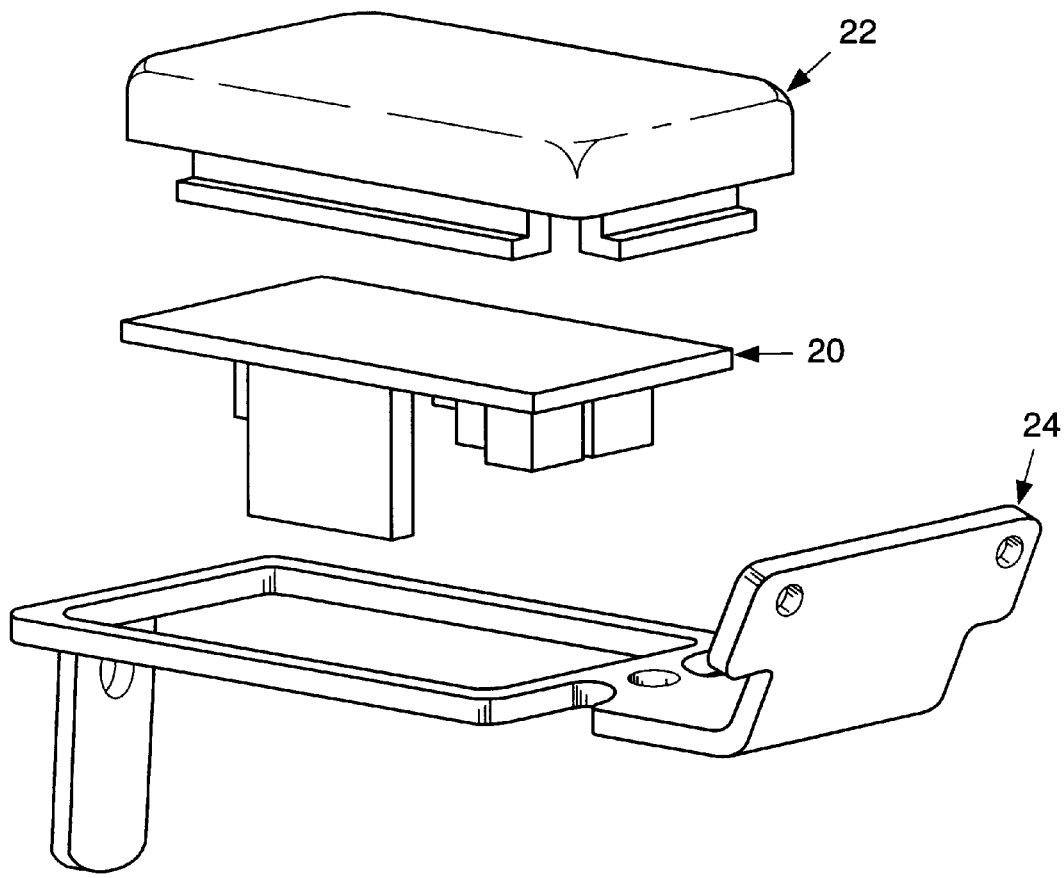
FIG. 1 is an exploded perspective view of a shell structure for retaining a printed circuit board and mounting in a mounting bracket in accordance with the present invention.

Referring to FIG. 1, components of an assembly for retaining a printed circuit board 20 are shown including a hollow shell structure 22 that may be inserted in mounting bracket 24. The shell structure 22 is shown in greater detail in FIGS. 2 through 5. An aperture in some portion of the shell structure 22 is provided to allow printed circuit board 20 to be inserted in the shell structure 22. In the preferred embodiment of the present invention shown in FIGS. 2 through 5, the bottom of the shell structure 22 is substantially open, providing an aperture 26 for receiving printed circuit board 20.

A rim 28 extends around the perimeter of the aperture 26 as best shown in FIG. 2. The present invention includes flexible flanges 30 extending from at least a portion of rim 28 in a manner that provides means to retain the shell structure 22 in the mounting bracket 24. Various configurations of flexible flanges 30 are anticipated as the shell structure 22 may have any shape required for retaining different printed circuit boards 20. In a preferred embodiment, a flexible flange 30 extends from each side of rim 28, however, other embodiments having only two flexible flanges 30, each extending from adjacent or opposite sides, is anticipated. Other embodiments having one flexible flange 30 extending completely or substantially around the rim 28, or three flexible flanges 30 extending from three sides of the rim 28, are also anticipated. The flexible flanges 30 may be substantially straight, or curved, depending on the shape of rim 28. The flexible flange 30 is capable of bending in a manner that allows the flexible flanges 30 to be inserted in and removed from mounting bracket 24 as described hereinbelow. The flexible flanges 30 are also capable of returning substantially to the shape they had prior to having been bent during insertion or removal from mounting bracket 24. As shown in FIG. 3, flexible flange 30 has an L-shape to create a neck portion 32 between the rim 28 and a lower tab 34 of flexible flange 30. The neck portion 32 engages an inner edge of a frame in the mounting bracket 24 as described hereinbelow to retain the shell structure 22 in the mounting bracket 24.

The shell structure 22 advantageously includes an inner slot 35 as shown in FIG. 4a that is sized to fit snugly around the perimeter of printed circuit board 20 when the printed circuit board 20 is inserted in the shell structure 22. The inner slot 35 may extend wither partially or completely around the perimeter of printed circuit board 20. The inner slot 35 helps prevent breakage of components on the printed circuit board 20, which might otherwise occur if the printed circuit board 20 was allowed to move within the shell structure 22. Further, this helps maintain connections with any connectors (not shown) attached to components on the printed circuit board 20. To protect the printed circuit board 20, the shell structure 22 may be constructed of a highly dielectric material that electrically insulates printed circuit board 20 from electro-static discharge and/or other types of electrical damage or interference. The shell structure 22 may also be constructed from material that absorbs shock and vibrations, to further protect the printed circuit board 20 and components thereon from damage.

FIGS. 6 through 9 show mounting bracket 24 in greater detail including a frame portion 36 for engaging the flexible flanges 30 of shell structure 22. The frame portion 36 includes an inner perimeter 38 around opening 40. The opening 40 and inner perimeter 38 are shaped and sized to retain shell structure 22 by engaging neck portion 32 with inner perimeter 38 and supporting shell structure 22 on frame portion 36.

The flexible flanges 30 and shell structure 22 are constructed of material that allows them to bend when force is applied. The material also has elastic properties that cause the flexible flanges 30 and shell structure 22 to spring substantially back to the shape they originally had before being bent. The rim 28 snaps over printed circuit board 20 to insert printed circuit board 20 into inner slot 35 in shell structure 22. The flexible flanges 30 may be bent outwardly away from aperture 26 to facilitate inserting printed circuit board 20 into the slot 35 in shell structure 22. In order to insert shell structure 22 in opening 40, flexible flanges 30 are bent inwardly toward aperture 26 as shell structure 22 is lowered into opening 40. Since the flexible flanges 30 spring substantially back to their original shape when they are released, the shell structure 22 is retained in the frame by lower tab 34. To remove the shell structure 22, force is applied to bend lower tabs 34 toward aperture 26. With the lower tabs 34 bent inwardly, the shell structure 22 may be lifted from the frame portion 36.

An important feature of the present invention is that means for retaining shell structure 22 and printed circuit board 20 in frame portion 36 are integrated with the structure of the shell structure 22. No additional fasteners or structure is required to retain printed circuit board 20 in shell structure 22, or to retain shell structure 22 in frame portion 36.

An optional feature that may be included with mounting bracket 24 is additional support structure 42 attached to, or integrally formed with, frame portion 36 for mounting additional hardware components within a device. The support structure 42 may be configured to support various hardware components as required, such as one or more control switches. The hardware components may or may not be connected to printed circuit board 20. The support structure 42 may include means for attaching hardware components such as holes 44, 46 for attachment screws. Other attachment means such as clips and flanges may be included in addition to or instead of holes 44, 46.

Means for attaching mounting bracket 24 to or within a device may also be included such as mounting tab 48, which also may include a hole 50 for an attachment screw. Other suitable fastening or attaching means known in the art may be included instead of, or in addition to, mounting tab 48, depending on the device and the location where the mounting bracket 24 is to be attached.

FIGS. 10 through 12 show an example of a control switch assembly 52 attached to support structure 42. The control switch assembly 52 provides an interface for an operator to exert force indicating a desired speed and direction for controlling movement of a device. A more detailed description of this control switch assembly 52 is provided in the Assignee's copending application entitled, "Apparatus For Limiting Forces Applied To A Control Stick" (Attorney Docket No. 98-196), which was filed on the same day as the present application and is hereby incorporated by reference.

The control switch assembly 52 includes means for converting the forces to electrical output signals. The signals are conditioned using signal conditioning electronics that may be implemented on printed circuit board 20. Connector 54 provides electrical communication between control switch assembly 52 and printed circuit board 20.

As shown in FIGS. 10 through 12, the present invention provides means for retaining printed circuit board 20 along with optional means for retaining one or more control switch assemblies 52 that provide input to printed circuit board 20 and means for attaching the mounting bracket 24 within a device.

INDUSTRIAL APPLICABILITY

The present invention is applicable in any situation where an embedded microprocessor or printed circuit board is located in a device. The retaining structure has a compact packaging design that is easy to assemble and adaptable to different sizes of devices and printed circuit boards. Some examples of these types of devices include various hand held devices such as a mouse on a computer, a hand held radio, or a mobile cellular phone.

Figure 13:
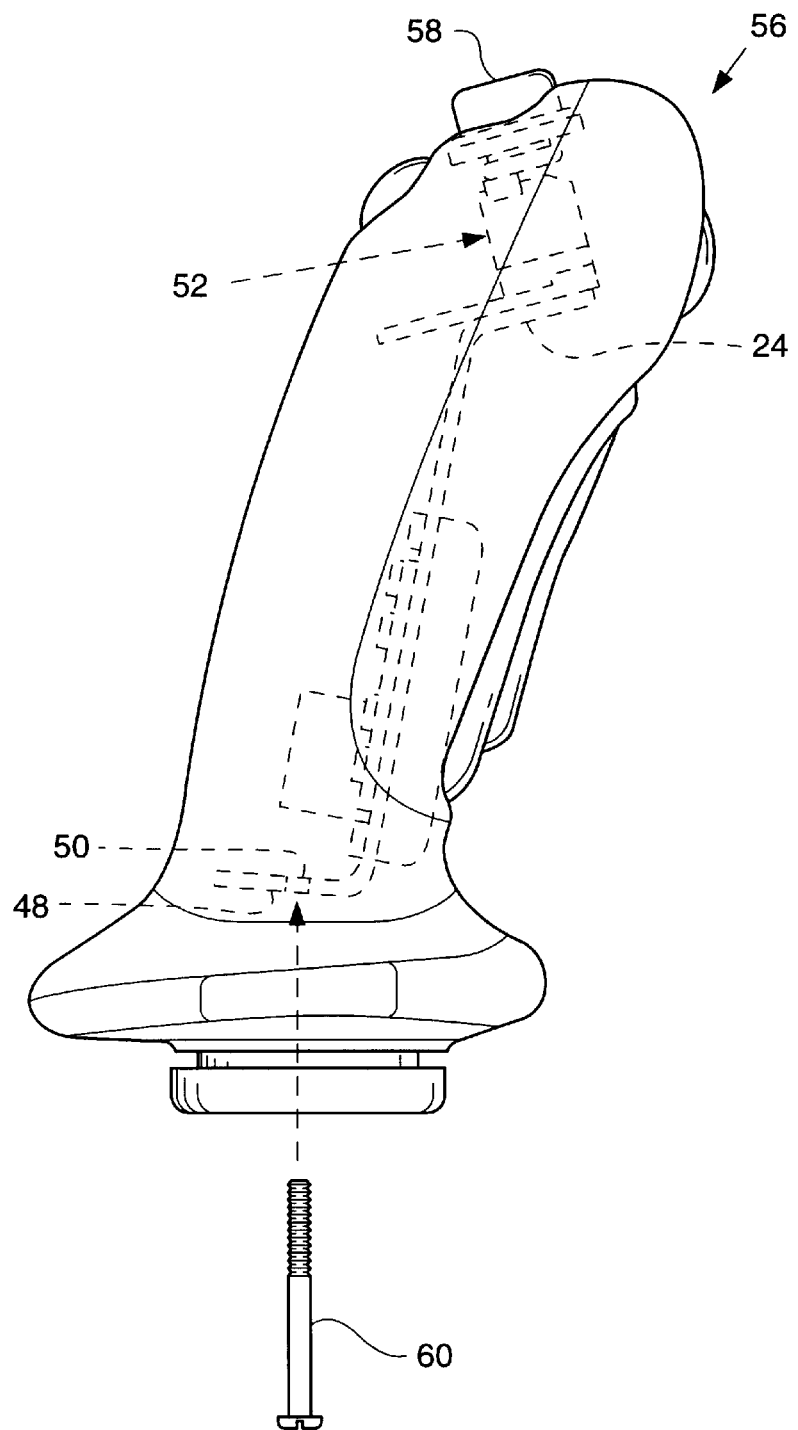
FIG. 13 is a cross-sectional side view of a hand grip including a retaining structure in accordance with the present invention.

An example of an application that requires compact packaging with shock and vibration resistance for a printed circuit board is hand grip assembly 56, as shown in FIG. 13. Hand grip assembly 56 is representative of control devices that are often provided for operators of systems with moving components and other subsystems requiring operator input. The present invention may be mounted in hand grip assembly 56 and control switch assembly 52 is accessed by the operator through an opening in which control switch 58 is mounted. The mounting bracket 24 is held in place within hand grip assembly 56 using a fastener, such as screw 60, through hole 50 in mounting tab 48 and another hole (not shown) in the outer portion of hand grip assembly 56. The angular orientation of supporting structure 42 and mounting tab 48 with respect to frame portion 36 may be adjusted to conform to and fit within the shape of the inner portion of the hand grip assembly 56. One or more mounting brackets 24 may be incorporated in hand grip assembly 56 or other locations such as a panel.

Other aspects, objects and advantages of the present invention can be obtained from a study of the drawings, the disclosure and the appended claims.

We claim:

1. An apparatus for retaining a printed circuit board, comprising:

a flexible shell structure;

a flexible flange coupled with the shell structure so as to form a recess, the recess operable to receive and retain at least a portion of the printed circuit board, tho flange operable to flex to receive the printed circuit board and to spring substantially back to its pre-flexed shape after receiving the printed circuit board; and a mounting bracket operable to engage the flexible flange, and wherein the flexible flange is operable to bend to allow the insertion of the shell structure into the mounting bracket and to return substantially to the shape it had prior to having been inserted into the mounting bracket.

2. The apparatus of claim 1 wherein the flexible flange is sized to fit snugly around at least a portion of a perimeter of the printed circuit board.

3. The apparatus of claim 1 wherein the shell structure and flange comprise a dielectric material.

4. The apparatus of claim 1 wherein at least one of the shell structure and flange comprising a shock-absorbing material.

5. An apparatus for retaining a printed circuit board, comprising:

a flexible shell structure having an aperture for receiving the printed circuit board, and an inner slot disposed around at least a portion of the aperture, the slot operable to receive and retain at least a portion of the printed circuit board within the shell structure, the shell structure operable to flex to enlarge the aperture to receive the printed circuit board within the inner slot and to substantially resume its pre-flexed shape after receiving the printed circuit board, the shell structure also including a flexible flange; and a mounting bracket operable to engage the flexible flange, and wherein the flexible flange is operable to bend to allow the insertion of the shell structure into the mounting bracket and to return substantially to the shape it had prior to having been inserted in the mounting bracket.

6. The apparatus, as set forth in claim 5 wherein the inner slot is sized to fit snugly around a perimeter of the printed circuit board.

7. The apparatus as set forth in claim 5 wherein the shell structure comprises a dielectric material that substantially electrically insulates the printed circuit board.

8. The apparatus as set forth in claim 5 wherein the shell structure comprises a shock-absorbing material.

9. The apparatus of claim 5 wherein the inner slot extends around an entire perimeter of the aperture.

\* \* \* \* \*